United States Patent [19]
Ohtani et al.

[11] Patent Number: 6,091,115
[45] Date of Patent: *Jul. 18, 2000

[54] SEMICONDUCTOR DEVICE INCLUDING A CRYSTALLINE SILICON FILM

[75] Inventors: Hisashi Ohtani; Etsuko Fujimoto, both of Kanagawa, Japan

[73] Assignee: Semiconductor Energy Laboratory Co., Ltd., Japan

[*] Notice: This patent issued on a continued prosecution application filed under 37 CFR 1.53(d), and is subject to the twenty year patent term provisions of 35 U.S.C. 154(a)(2).

[21] Appl. No.: 08/970,728

[22] Filed: Nov. 14, 1997

[30] Foreign Application Priority Data

Nov. 15, 1996 [JP] Japan .................... 8-320969

[51] Int. Cl.⁷ .................. H01L 29/76; H01L 29/94; H01L 31/062; H01L 31/113; H01L 31/119
[52] U.S. Cl. .................. 257/369; 257/371; 257/412; 257/413; 257/750; 257/762; 257/766; 438/153; 438/154
[58] Field of Search .................. 257/412, 413, 257/766, 762, 750, 369, 371; 438/154, 153

[56] References Cited

U.S. PATENT DOCUMENTS

| | | | |
|---|---|---|---|
| 4,319,395 | 3/1982 | Lund et al. | 257/346 |
| 4,399,605 | 8/1983 | Dash et al. | 29/571 |
| 4,905,073 | 2/1990 | Chen et al. | 357/67 |
| 5,061,647 | 10/1991 | Roth et al. | 257/407 |
| 5,247,198 | 9/1993 | Homma et al. | 257/371 |

*Primary Examiner*—William Mintel
*Attorney, Agent, or Firm*—Fish & Richardson PC

[57] ABSTRACT

A semiconductor device having a CMOS structure comprising N-channel type and P-channel type insulated gate semiconductor devices combined in a complementary manner, wherein the threshold voltage of the insulated gate semiconductor devices is controlled by using the difference in work function between the gate electrode and the active layer. The present semiconductor device has excellent uniformity and reproducibility.

16 Claims, 2 Drawing Sheets

N-TYPE TRANSISTOR          P-TYPE TRANSISTOR

N-TYPE TRANSISTOR          P-TYPE TRANSISTOR

SEMICONDUCTOR DEVICE INCLUDING A CRYSTALLINE SILICON FILM

BACKGROUND OF THE INVENTION

1. Field of the Invention

The present invention relates to an insulated gate type semiconductor device using a crystalline semiconductor film. In particular, it relates to a semiconductor device having a CMOS structure using silicon film for the semiconductor film.

2. Description of the Related Art

Recently, active development is made on the CMOS technology using insulated gate type transistor. However, as is disclosed in Japanese Unexamined Patent Publication Hei 4-206971 and in Japanese Unexamined Patent Publication Hei 4-286339, the electric properties of an N-type transistor using a crystalline silicon film for the active layer tend to shift to the direction of depression (negative side), whereas those of a P-type transistor tend to shift to the enhancement direction (negative side).

More specifically, the threshold voltage of an N-type transistor (Vth,n) tends to lower, whereas that of a P-type transistor (Vth,p) tends to elevate. This difference in threshold voltage makes it difficult to determine the voltage of the power source.

To overcome the problem above, a variety of methods have been proposed for controlling the threshold value. For instance, in the field of ICs, in general, the threshold value is controlled by the carrier density; the method comprises changing the impurity concentration of the well or of the channel region. Also proposed is a method comprising changing the impurity concentration of the gate electrode made from a polysilicon film, wherein the threshold value is controlled by the difference in work function (e.g., in Dual gate CMOS structure, etc.)

The basic constitution of the methods above for controlling the threshold value is to control the threshold voltage by the concentration of the added impurity. However, controlling the impurity concentration has a disadvantage in that it has difficulties from the viewpoint of achieving uniformity and reproducibility, and many factors remain uncertain in constantly controlling the threshold value to a constant value.

Furthermore, with increasing fineness in semiconductor devices, the influence on carriers cast by the impurity elements that are present in the channel forming region becomes non-negligible. Thus, the method of controlling the threshold value by means of impurity concentration sometimes lowers the operation speed of the semiconductor device.

SUMMARY OF THE INVENTION

An object of the present invention is to provide, in the field of semiconductor devices having a CMOS structure, a technology which realizes control of the threshold voltage of N-type and P-type transistors by a method other than the addition of impurities.

Thus, the present invention provides a method of controlling the threshold voltage (Vth) in an insulated-gate semiconductor device having a MOS (Metal-Oxide-Semiconductor) structure by using the difference in work function between the gate electrode and the active layer. More specifically, the present invention is characterized in that, among the materials constituting the gate electrode, at least the material on the surface of the gate electrode which is brought into contact with the gate insulating film is controlled so that it is an electrically conductive material capable of realizing the desired threshold voltage.

Accordingly, a constitution of the present invention is characterized in that it is a semiconductor device having a CMOS structure comprising N-channel type and P-channel type semiconductor devices combined in a complementary manner, the semiconductor devices each having at least semiconductor source and drain regions, a gate insulating film, and a gate electrode, wherein: the gate electrode of the N-channel type semiconductor device is constructed by a first wiring material; and at least the surface of the gate electrode of the P-channel type semiconductor device in contact with the gate insulating film is constructed by a second wiring material differing from the first wiring material in work function.

Another constitution of the present invention is characterized in that it is a semiconductor device having a CMOS structure comprising N-channel type and P-channel type semiconductor devices combined in a complementary manner, the semiconductor devices each having at least semiconductor source and drain regions, a gate insulating film, and a gate electrode, wherein: the gate electrode of the P-channel type semiconductor device is constructed by a first wiring material; and at least the surface of the gate electrode of the N-channel type semiconductor device in contact with the gate insulating film is constructed by a second wiring material differing from the first wiring material in work function.

The first wiring material mainly constitutes the gate electrode, and various types of electrically conductive materials can be mentioned. Aluminum and materials containing aluminum as the principal component thereof have low resistivity, and are effective for lowering the delay in wiring.

The second wiring material is a material differing from the first wiring material in work function, and the material must be specified experimentally. The gate electrode may be entirely constructed by the second wiring material, or only the surface thereof in contact with the gate insulating film may be constructed by the second wiring material. Which constitution will be adopted is determined according to necessity.

For instance, let us consider a case of constructing a CMOS circuit (i.e., a semiconductor device having a CMOS structure) having a gate electrode made from a first wiring material alone, and suppose a threshold voltage having a negative deviation is obtained similar to the prior art. Based on the thus obtained threshold voltage, suppose that there is a requirement for shifting the threshold voltage of the P-channel type semiconductor device alone to the positive side.

In this case, the threshold voltage can be shifted to the positive side by constituting at least the surface of the gate electrode of the P-channel type semiconductor device, which is in contact with the gate insulating film, from a second wiring material having a work function greater than that of the first wiring material.

If aluminum or materials containing aluminum as the principal component thereof is used for the first wiring material in the case above, usable as a material having a larger work function (a second wiring material) is a material of an element selected from the group consisting of Cr, Ni, Ge, Pd, W, Pt, Au, Co, Cu, Fe, Zn, Mo, Sn, and Ag.

As a matter of course, the threshold voltage of the N-channel type semiconductor device alone can be controlled depending on the requirements, and in cases, the threshold voltage of both N-channel type and P-channel type semiconductor devices can be controlled independently to each other. Furthermore, by selecting a second wiring material having a work function smaller than that of the first wiring material, the threshold voltage can be shifted to the negative side.

As described above, the present invention provides a technique of controlling the threshold voltage to a desired value by only using the difference in work function between the gate electrode and the active layer. Accordingly, the basic concept of the present invention is fundamentally different from that of the conventional technology of controlling the threshold voltage by changing the impurity concentration. Thus, the technique according to the present invention is characterized in that it promises excellent reproducibility and that it does not lower the operation speed of the semiconductor device.

It should be noted that the term threshold voltage has various definitions, and that the comparison of absolute values thereof becomes meaningless once a different definition is taken. In the present invention, however, the discussion is made on the relative shift of the threshold value. For reference, the threshold value is defined herein as follows. That is, in a graph obtained by plotting the values by taking the gate voltage (Vg) in the abscissa and the root of the drain current (Id $^{1/2}$) in the ordinate, the contact point of the extrapolation of Id $^{1/2}$ in its maximum gradient with Vg axis is taken as the threshold voltage (Extrapolated root Id method).

BRIEF DESCRIPTION OF THE DRAWINGS

In the accompanying drawings.

DETAILED DESCRIPTION OF THE PREFERRED EMBODIMENTS

In controlling the threshold voltage of an insulated gate semiconductor device, the present invention utilizes the difference in work function between the gate electrode and the active layer. In this case, the difference in work function can be changed intentionally by providing, on at least the surface of the gate electrode that is brought into contact with the gate insulating film, an electrically conductive film capable of realizing the desired threshold voltage.

The present invention can be applied to either one of the N-channel and P-channel semiconductor devices, or to both thereof. That is, the technique can be effected to the semiconductor devices independently to each other.

The technique according to the present invention is particularly effective to semiconductor devices having a CMOS structure in which the deviation of threshold voltage is found problematic. Thus, the present technique enables custom designing a CMOS circuit; for instance, a CMOS circuit of low power consumption or a CMOS circuit for high speed operation can be designed depending on the requirements.

EXAMPLE 1

Figure 1:
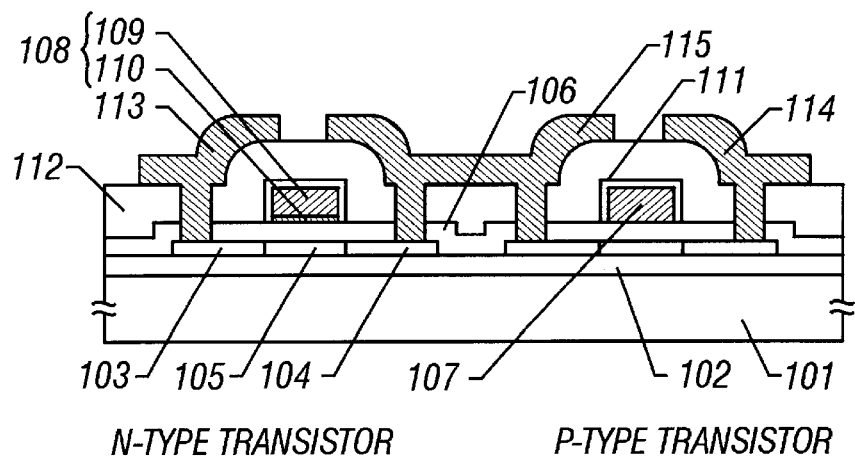
FIG. 1 shows a structure of a CMOS circuit according to the present invention.

FIG. 1 shows a cross section of a CMOS circuit manufactured according to an embodiment of the present invention. More specifically, the CMOS circuit utilizes a thin film transistor (TFT) as the insulated gate semiconductor device. In the present example, a material containing aluminum as the principal component thereof is used as the first wiring material mainly constituting the gate electrode. Furthermore, the CMOS circuit according to the present example stresses the low power consumption characteristics.

Since the N-type and the P-type transistors which constitute the CMOS circuit are basically of the same structure, the description is made only on the N-type transistor except for cases where specific explanation for a P-type transistor is necessary.

Referring to FIG. 1, the structure comprises a base film 102 of silicon oxide formed on a glass substrate 101. An active layer constituted of a source region 103, a drain region 104, and a channel forming region 105 is formed on the base film 102. The crystalline silicon film constituting the active layer may be formed directly by CVD process, or a means of crystallizing an amorphous silicon film may be employed.

A gate insulating film 106 made of silicon oxide is formed, and an aluminum film containing 0.2% by weight of scandium is formed thereon to provide a gate electrode. The present invention is applied to the constitution of the gate electrode. In the present example, the gate electrode 107 of the P-channel type semiconductor device is formed by aluminum film alone, and the gate electrode 108 of the N-channel type semiconductor device is formed by a laminated structure comprising an aluminum film 109 and a Cr (chromium) film 110. The reason for employing such a structure is explained hereinafter.

Then, a dense anodic oxide film 111 is formed on the surface of the gate electrodes 107 and 108 by means of anodic oxidation. The anodic oxide film 111 protects the surface of the gate electrodes from heat and plasma damages.

The gate electrodes 107 and 108 are then covered by an interlayer insulating film 112, and source wirings 113 and 114 as well as a drain wiring 115 are formed to be insulated and isolated from the gate electrodes 107 and 108. From the viewpoint of increasing the speed of device operation, those wirings are preferably formed by using a material containing aluminum as the principal component thereof.

By applying the present invention, the CMOS circuit structure shown in FIG. 1 can be obtained. It differs from the conventional CMOS circuits in that the gate electrode of the N-type transistor alone is constructed by a laminated structure of electrically conductive thin films differing in work function. The reason why such a structure is employed in the present example is described below.

According to the results observed by the present inventors on the electric properties of a CMOS circuit obtained without applying the present invention, in the case of forming the gate electrode only from an aluminum film containing scandium, it is found that the threshold voltage for both of the N-type and the P-type transistors shifts to the negative side.

Figure 2A:
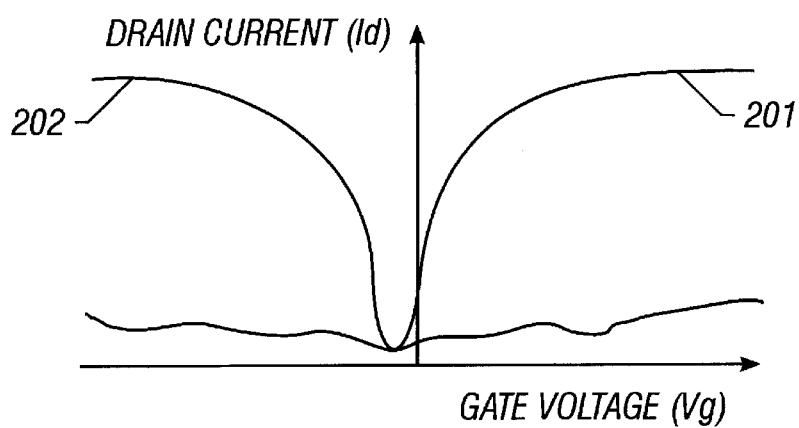
FIGS. 2A and 2B show the electric characteristics of a CMOS circuit of the invention.

The shift of the threshold voltage to the negative side signifies, as is shown in FIG. 2A, that the Id-Vg characteristics (Id-Vg curve) which shows the electric characteristics of the TFT is wholly shifted to the negative side. This shift is a complex consequence of a difference in work function and the problems associated with the process (e.g., the film quality of the gate insulating film or the active layer). In the figure, the Id-Vg characteristics for the N-type transistor and that for the P-type transistor are indicated by numerals 201 and 202, respectively.

Figure 2B:
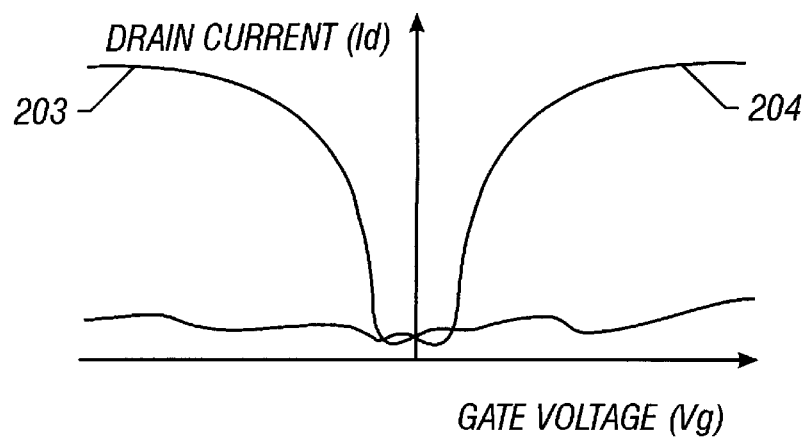

In contrast to above, a CMOS circuit manufactured in accordance with the present invention exhibits an electric (Id-Vg) characteristics as is shown in FIG. 2B. That is, the Id-Vg characteristics 203 of the P-type transistor remains unchanged, while characteristics 204 of the N-type transistor wholly shifts to the positive side. This shift is attributed to the influence cast on the N-type transistor alone by the difference in work function.

By taking the window (the difference in threshold voltage between the N-type and P-type transistors) widely enough, the CMOS circuit which exhibits the Id-Vg characteristics as is shown in FIG. 2B can realize a circuit constitution having a small idle leak current. Thus, the constitution according to the present example is effective for realizing a CMOS circuit which places stress on low power consumption characteristics.

EXAMPLE 2

The present example refers to a CMOS circuit according to an embodiment of the present invention, which stresses high speed operation characteristics. Because the basic structure of the CMOS circuit is the same as that shown in FIG. 1, the same reference numerals or symbols as those used in Example 1 are used below except for the differing portions.

In contrast to Example 1 above, the CMOS circuit of the present example capable of high speed operation preferably exhibits an Id-Vg characteristics having a narrow window (or an Id-Vg characteristics in which the N-type and P-type transistors have a crossed region). This constitution is requisite for swiftly switching the ON/OFF of N-type and P-type transistors constituting the CMOS circuit.

Figure 3:
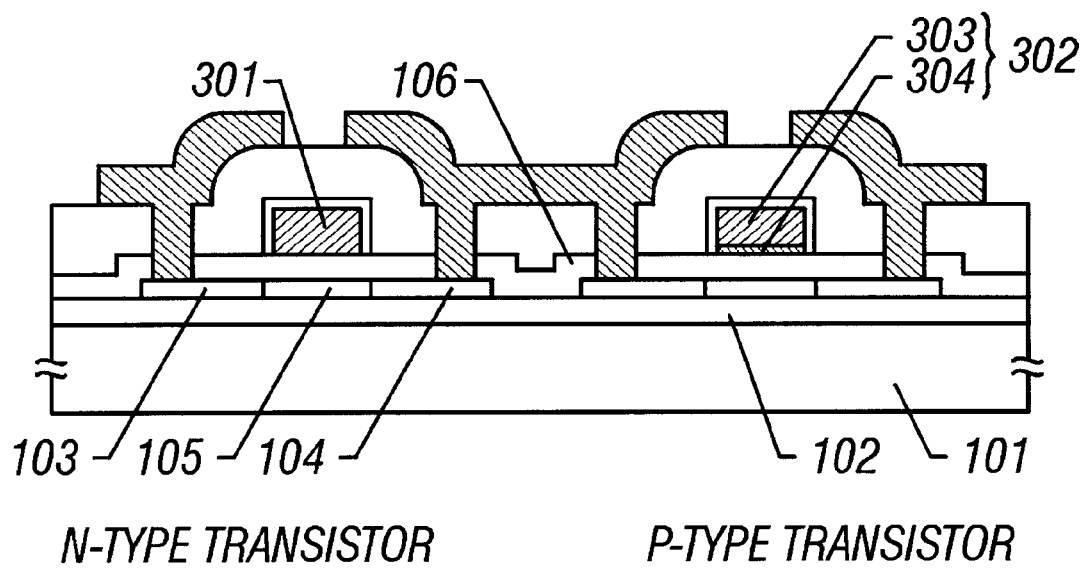
FIG. 3 shows a structure of a CMOS circuit of the invention.

By taking the above requirements into consideration and by applying the present invention, a CMOS circuit of a constitution illustrated in FIG. 3 can be obtained. The structure shown in FIG. 3 is for a case in which the gate electrode of the P-type transistor alone employs a laminated structure of electrically conductive thin films differing in work function.

Referring to FIG. 3, the gate electrode 301 of the N-type transistor is constructed only of a material comprising aluminum containing scandium, and the gate electrode 302 of the P-type transistor is constructed by a laminated structure of an aluminum film 303 and a W (tungsten) film 304.

Figure 4:
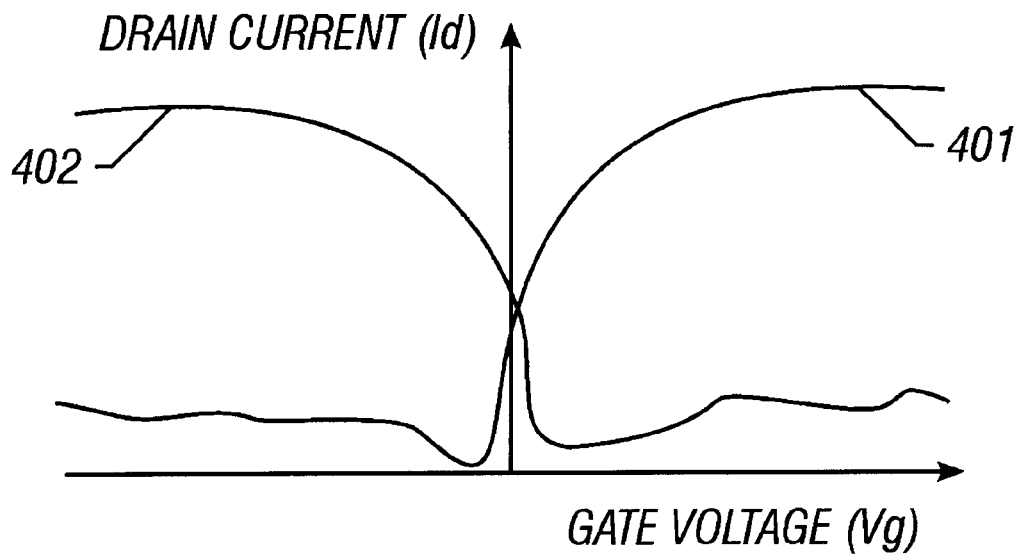
FIG. 4 shows the electric characteristics of a CNMOS circuit of the invention.

In the case of the constitution according to the present example, the Id-Vg characteristics 201 and 202 shown in FIG. 2A shifts to a state as is shown in FIG. 4. That is, the Id-Vg characteristics 401 of the N-type transistor remains unchanged, whereas the Id-Vg characteristics 402 of the P-type transistor wholly shifts to the positive side to cause crossing of the Id-Vg characteristics 401 and 402 for the N-type and P-type transistors.

The CMOS circuit which realizes the Id-Vg characteristics described above enables a continuous operation of N-type and P-type transistors. Accordingly, it enables a swift switching of ON/OFF operations. Thus, it provides a CMOS circuit having high speed operation characteristics applicable to constitutions which are driven in a high frequency region, such as in the case of logic circuits.

Furthermore, by applying a known silicide technology to the source/drain regions of the CMOS circuit having the constitution illustrated in FIG. 3, a contact with low resistivity can be realized, which is effective for obtaining high speed operation characteristics.

EXAMPLE 3

In Examples 1 and 2 above, materials containing aluminum as the principal component have been exemplified as the first wiring materials which mainly constitute the gate electrode. However, electrically conductive materials such as tantalum, molybdenum, and tungsten or a crystalline silicon film (polycrystalline silicon film) imparted with electric conductivity can be used as well.

In employing such a constitution, the selection of the second wiring material, which is the characteristic of the present invention, is done by taking the kind of materials used for the gate electrode into consideration. That is, the first and the second wiring materials are not limited to specific materials, but can be properly selected so long as the constitution falls within the scope of the present invention.

EXAMPLE 4

The present invention is applicable to any type of insulated gate semiconductor devices, and it can be applied to IGFETs, power MOS devices, etc., that are formed on single crystal silicon. Furthermore, it is applicable to SOI structures using thin film single crystal silicon or an amorphous silicon TFT using an amorphous silicon film for the active layer thereof.

Moreover, the present invention is not only applicable to top gate type TFTs as described in Examples 1 and 2, but also to bottom gate type TFTs.

As described above, the present invention has a very wide field of application, and is applicable to any type of insulated gate semiconductor device irrespective of the structure, so long as the device is driven by controlling the gate voltage. The present invention is particularly effective in constituting a CMOS circuit in which an insulated gate N-type and P-type transistors are combined in a complementary arrangement.

EXAMPLE 5

Various types of logic circuits are available by using an insulated gate semiconductor device according to the present invention or by using the CMOS circuit which results from a combination of the semiconductor devices according to the present invention. Any type of integrated circuits, for instance, the pixel TFTs and peripheral drive circuits for electrooptical devices (e.g., liquid crystal display devices, EL display devices, EC display devices, etc.), memory circuits, arithmetic circuits, etc., can be constructed by using the present invention.

Furthermore, VLSI circuits or ULSI circuits in two-dimensional or three-dimensional structure, such as the DPAM circuits, SRAM circuits, and BiCMOS circuits, can be implemented by combining the circuits above with the circuits obtained using IC circuit or SOI technology.

The thus obtained integrated circuits each specialized in low power consumption or high speed operation are usable in various types of electronic appliances, such as video cameras, portable information terminal equipment (e.g., personal handyphone systems, mobile computers, etc.), projection displays, and the like.

As described above, the technology according to the present invention controls the threshold voltage of an insulated gate semiconductor device by properly selecting the material for the gate electrode to thereby change the difference in work function. Thus, by utilizing the present invention, threshold voltage can be controlled with excellent reproducibility and uniformity without employing any control methods based on impurity concentration.

Furthermore, by applying the present invention to a semiconductor device having a CMOS structure (CMOS circuit), the deviation in threshold voltage of N-type and P-type transistors can be corrected, and hence, a CMOS circuit capable of realizing the desired characteristics can be implemented.

While the invention has been described in detail by referring to specific examples, it should be understood that various modifications can be made thereto without departing from the scope of the present invention.

What is claimed is:

1. A semiconductor device comprising:

a substrate;

a p-channel type transistor and an n-channel type transistor formed on said substrate and connected in a complementary manner, said n-channel type transistor comprising:
  a crystalline semiconductor film comprising silicon having a source, a drain and a channel formed of an intrinsic semiconductor and located between said source and said drain without doped impurities;
  a gate insulating layer formed over said film to cover at least said channel; and
  a gate electrode formed on said gate insulating layer and adjacent to said channel, said gate electrode having a laminated structure comprising a first layer apart from said gate insulating layer and a second layer in contact with said gate insulating layer and said first layer,
  wherein said second layer comprises a material selected from the group consisting of Cr, Ni, Ge, Pd, W, Pt, Au, Co, Cu, Fe, Zn, Mo, Sn and Ag, wherein said p-channel type transistor comprises:
  a crystalline semiconductor film comprising silicon having a source, a drain and a channel formed of an intrinsic semiconductor and located between said source and said drain without doped impurities;
  a gate insulating layer formed over said film to cover at least said channel; and
  a gate electrode adjacent to said channel and formed over said gate insulating layer, wherein said gate electrode comprises aluminum.

2. A semiconductor device comprising a p-channel type transistor and an n-channel type transistor connected in a complementary manner, wherein said n-channel type transistor comprises:
  a crystalline semiconductor film comprising silicon having a source, a drain and a channel formed of an intrinsic semiconductor and located between said source and said drain without doped impurities;
  a gate insulating layer formed over said film to cover at least said channel; and
  a gate electrode formed on said gate insulating layer and adjacent to said channel, said gate electrode having a laminated structure comprising a first layer apart from said gate insulating layer and a second layer in contact with said gate insulating layer and said first layer, said second layer including a material selected from the group consisting of Cr, Ni, Ge, Pd, W, Pt, Au, Co, Cu, Fe, Zn, Mo, Sn and Ag, and wherein said p-channel type transistor comprises:
  a crystalline semiconductor film comprising silicon having a source, a drain and a channel formed of an intrinsic semiconductor and located between said source and said drain without doped impurities;
  a gate insulating layer formed over said film to cover at least said channel; and
  a gate electrode adjacent to said channel and formed over said gate insulating layer, said gate electrode configured to have a portion which is in contact with said gate insulating layer portion and comprises aluminum.

3. The device of claim 2 wherein said semiconductor device is provided in a logic circuit.

4. The device of claim 2 wherein said p-channel type transistor and said n-channel type transistor are top gate type transistors.

5. The device of claim 2 wherein said p-channel type transistor and said n-channel type transistor are bottom gate type transistors.

6. A semiconductor device comprising a p-channel type transistor and an n-channel type transistor connected in a complementary manner, each of said p-channel type transistor and said n-channel type transistor comprising:
  a crystalline semiconductor film comprising silicon having a source, a drain and a channel formed of an intrinsic semiconductor and located between said source and said drain without doped impurities; and
  a gate electrode provided adjacent to said channel with a gate insulating layer therebetween, said gate electrode having a laminated structure comprising a first layer apart from said gate insulating layer-and a second layer provided in contact with said gate insulating layer and said first layer,
  wherein said second layer comprises a material selected from the group consisting of Cr, Ni, Ge, Pd, W, Pt, Au, Co, Cu, Fe, Zn, Mo, Sn and Ag, and said first layer has a portion that is in contact with said second layer and comprises aluminum.

7. The device of claim 6 wherein said semiconductor device is provided in a logic circuit.

8. The device of claim 6 wherein said p-channel type transistor and said n-channel type transistor are top gate type transistors.

9. The device of claim 6 wherein said p-channel type transistor and said n-channel type transistor are bottom gate type transistors.

10. The device of any one of claim 1, 2 or 6 wherein the channels of the p-channel type transistor and the n-channel type transistor have a same conductivity type as each other.

11. The device of any one of claim 1, 2 or 6 wherein said device is a liquid crystal device.

12. The device of any one of claim 1, 2 or 6 wherein said device is an electroluminescent device.

13. The device of any one of claim 1, 2 or 6 wherein said device is an electrochronic device.

14. The device of any one of claim 1, 2 or 6 wherein said device is selected from the group consisting of DRAM, SRAM and BiCMOS.

15. The device of any one of claim 1, 2 or 6 wherein said device is a video camera.

16. The device of any one of claim 1, 2 or 6 wherein said device is an information terminal equipment selected from the group consisting of a personal handy phone system and a mobile computer.

* * * * *